(12) United States Patent
Averay

(10) Patent No.: US 11,057,045 B2
(45) Date of Patent: Jul. 6, 2021

(54) AUTOMATIC GAIN CONTROL FOR ANALOG TO DIGITAL CONVERTERS

(71) Applicant: BAE Systems Australia Limited, Edinburgh (AU)

(72) Inventor: Robert Dennis Averay, Alice Springs (AU)

(73) Assignee: BAE Systems Australia Limited, Edinburgh (AU)

(*) Notice: Subject to any disclaimer, the term of this patent is extended or adjusted under 35 U.S.C. 154(b) by 0 days.

(21) Appl. No.: 16/966,364

(22) PCT Filed: Feb. 8, 2019

(86) PCT No.: PCT/AU2019/050095
§ 371 (c)(1),
(2) Date: Jul. 30, 2020

(87) PCT Pub. No.: WO2019/153044
PCT Pub. Date: Aug. 15, 2019

(65) Prior Publication Data
US 2020/0373935 A1 Nov. 26, 2020

(30) Foreign Application Priority Data

Feb. 8, 2018 (AU) ................................ 2018900387
Feb. 12, 2018 (AU) ................................ 2018900427

(51) Int. Cl.
*H03M 1/12* (2006.01)
*H03M 1/18* (2006.01)
*H03G 3/00* (2006.01)

(52) U.S. Cl.
CPC ............ *H03M 1/185* (2013.01); *H03G 3/001* (2013.01)

(58) Field of Classification Search
CPC ......... H03M 1/185; H03M 1/12; H03G 3/001
(Continued)

(56) References Cited

U.S. PATENT DOCUMENTS 5,451,948 A * 9/1995 Jekel ...................... H03G 3/001
341/139
5,917,865 A 6/1999 Kopmeiners et al.
(Continued)

OTHER PUBLICATIONS

International Search Report and Written Opinion for PCT Appl. No. PCT/AU2019/050095, dated Mar. 13, 2019, 12 Pages.
(Continued)

*Primary Examiner* — Jean B Jeanglaude
(74) *Attorney, Agent, or Firm* — Maine Cemota & Rardin

(57) ABSTRACT

A direct-digital receiver architecture is configured to make maximal use of the dynamic range of its analog to digital converter (ADC). The receiver includes an analog frontend that applies a variable gain factor to the analog input signal, a gain level unit that determines the variable gain factor by monitoring the digital signal that is output by the ADC, a gain scaling unit that determines a digital scale factor according to the determined gain factor, and a gain factor multiplier that multiplies the digital signal by the scale factor to produce a scaled digital signal, said multiplying being time aligned with the variable gain factor. The receiver further includes a digital signal processing train that is cognisant of the dynamic range of the ADC, variable gain factor and the digital scale factor for the time domain sample being processed.

5 Claims, 2 Drawing Sheets

(58) Field of Classification Search
USPC .......................................................... 341/155
See application file for complete search history.

(56) References Cited

U.S. PATENT DOCUMENTS

| | | | | |
|---|---|---|---|---|
| 6,480,528 | B1* | 11/2002 | Patel | H03G 3/3052 |
| | | | | 375/148 |
| 6,985,099 | B1* | 1/2006 | Luz | H03M 1/185 |
| | | | | 341/139 |
| 7,076,225 | B2 | 7/2006 | Li et al. | |
| 7,680,473 | B2* | 3/2010 | Liou | H04W 52/52 |
| | | | | 455/235.1 |
| 7,701,371 | B2* | 4/2010 | Krishnamoorthi | H03M 1/185 |
| | | | | 341/139 |
| 7,982,539 | B2* | 7/2011 | Shen | H03G 3/3036 |
| | | | | 330/279 |
| 9,209,770 | B2* | 12/2015 | Rozenblit | H03F 1/0211 |
| 10,735,038 | B2* | 8/2020 | Srinivasan | H04B 17/318 |
| 2002/0163979 | A1 | 11/2002 | Takatz et al. | |
| 2006/0003726 | A1* | 1/2006 | Razzell | H03M 1/185 |
| | | | | 455/323 |
| 2006/0222118 | A1 | 10/2006 | Murthy et al. | |
| 2008/0070535 | A1* | 3/2008 | Liou | H03G 3/3052 |
| | | | | 455/232.1 |
| 2009/0028365 | A1 | 1/2009 | Nygard et al. | |
| 2012/0163434 | A1* | 6/2012 | Kim | H04B 1/0007 |
| | | | | 375/222 |
| 2014/0361912 | A1* | 12/2014 | da Silva | H03M 1/185 |
| | | | | 341/118 |
| 2015/0023450 | A1* | 1/2015 | Rozenblit | H04L 1/0033 |
| | | | | 375/295 |

OTHER PUBLICATIONS

International Preliminary Report on Patentability for PCT Appl. No. PCT/AU2019/050095, dated Aug. 11, 2020, 6 Pages.

* cited by examiner

AUTOMATIC GAIN CONTROL FOR ANALOG TO DIGITAL CONVERTERS

RELATED APPLICATIONS

This application is a national phase application filed under 35 USC § 371 of PCT Application No. PCT/AU2019/050095 with an International filing date of Feb. 8, 2019 which claims priority of AU Patent Application 2018900378 filed Feb. 8, 2018 and AU Patent Application 2018900427 filed Feb. 12, 2018. All of these applications are incorporated herein by reference in their entirety for all purposes.

FIELD OF THE INVENTION

The present invention provides for systems and methods for providing an improved method of on-line automatic gain control in Analog to Digital conversion circuits for direct-digital receiver architectures, allowing for the enhanced utilisation of dynamic range.

BACKGROUND OF THE INVENTION

Any discussion of the background art throughout the specification should in no way be considered as an admission that such art is widely known or forms part of common general knowledge in the field.

A digital signal receiver architecture normally comprises an Analog Domain and a Digital Domain separated by an Analog to Digital Converter (ADC). The Analog Domain of a digital receiver, among other things, typically provides for some gain control in the form of a chain of amplifiers and attenuators. In cases where the external RF environment is subject to wide amplitude variation, the Analog Domain can have a variable attenuation to condition the amplitude of the RF signal prior to it being input to the ADC.

The ADC normally has a dynamic range given by its sensitivity (derived from the ADC internal structure) and the sample rate at which the ADC is operating. By varying the attenuation in the Analog Domain, the amplitude of the RF signal input to the ADC can be set to a value near the maximum input level of the ADC in order to maximise the use of the available ADC dynamic range, thereby providing for the best sensitivity for the digital receiver.

The Digital Domain of a digital receiver typically provides, among other things, firmware on a Digital Signal Processing (DSP) device that includes some form of Digital Down Converter (DDC) function. This component digitally mixes the ADC output samples with a numerical oscillator to bring the signal to a base band while outputting I and Q samples. It then digitally down converts the mixer IQ output to reduce the bandwidth to that of the region of interest, while increasing the IQ sample bit width above that of the ADC bit width to realise the full dynamic range of the ADC, and finally performs low pass filtering to the bandwidth of interest.

Digital receivers used at Medium Frequency (MF) and High Frequency (HF) bands (0.3-30 MHz) traditionally have used forms of automatic gain control to adjust to the changing signal environment. For many applications it is not particularly important to accurately know the actual gain (amplification) of the receiver. However, for Radar and other instrumentation applications it is important to know the receiver gain when post-processing digitised samples.

A typical digital receiver includes two places where the gain can be adjusted: The Analog section before the ADC and in the DDC.

Most digital receivers, including the earlier models of BAE Systems Digital Receiver (DRx), adjust the gain in the Analog section to allow the ADC to operate at the most optimum level. This is usually done manually and then the data from the receiver is scaled in the signal processing computer.

Some systems previously employed a scheme, called Automatic Level Control (ALC), where the receiver samples the HF environment for approximately 100 milliseconds and then adjusts the Analog gain for optimum ADC performance for the environment. The resultant gain of the Analog section is reported to the signal processing computer which scales the received samples.

There are two limitations of the current ALC. First, is sampling: the HF environment takes the receiver off line interrupting data collection. Second, is aligning the reported Analog gain with the received sample data for scaling is difficult due to the variable propagation time through the digital filter stages. In practice, it can only be performed when the receiver is halted. Gain changes during data collection, while desirable, are not practical.

A traditional digital receiver architecture employs some form of Automatic Level Control or Manual Level Control in the Digital Domain that measures the wideband power of the ADC samples and provides for control of an Analog Domain variable attenuation to keep the ADC input signal at some Headroom level below that of the ADC Overload point.

This traditional architecture can be as shown 20 in FIG. 1, with an analog domain 27 and digital domain 28. The analog input 21 is subjected to a variable front end gain 22, before analog to digital conversion 23, and digital decimation 24, forming I,Q outputs 29. The level is detected 25 and used to form a gain control factor for feedback to gain control 22. The IQ output is referenced to the ADC in 26. I.e. The digital receiver has an IQ output with a power level referenced to the input of the ADC. This means that the ADC dynamic range is fixed at some point within the dynamic range afforded by the IQ sample bit width. In order to realise the power at the input to the digital receiver, the digital receiver IQ output 29 must be post processed to accommodate for the variable attenuation of the Analog Domain.

Furthermore, when a variable attenuator is switched there are two effects. First, there is a step discontinuity in the IQ output that appears as though the external RF environment suddenly changed level. Second, the time period between when a variable attenuator starts to switch and when a variable attenuator finishes the switch the input level to the ADC is undefined and output samples from the ADC are corrupted.

The resulting ADC output sample corruption flows through the digital signal processing chain to corrupt the IQ output of the Digital Domain. This will result in 'blooming' in the frequency domain of the IQ output where the signal to noise ratio is significantly reduced during the attenuation switch, meaning that for many applications the digital receiver cannot be used to gather output samples while an Automatic or Manual Level Control is taking place.

As a result of this, it is often necessary to set a ADC Headroom level 32 to be a significant proportion of the ADC dynamic range, to prevent transient external RF variations from exceeding the ADC input level between level control cycles. However, this effectively reduces the dynamic range of the receiver since a large portion of it is dedicated to ADC Headroom.

SUMMARY OF THE INVENTION

It is an object of the invention, in its preferred form to provide an improved form of on-line automatic gain control allowing for enhanced dynamic range utilisation in analog to digital conversion circuits.

In accordance with a first aspect of the present invention, there is provided an analog to digital converter including: input signal reception unit for receiving an analog input signal; an analog frontend applying a variable gain factor to the analog input signal so as to produce a gain adjusted input signal; an analog to digital converter converting the gain adjusted input signal to a corresponding digital signal; a gain level unit for determining the variable gain factor via monitoring of the corresponding digital signal; a gain scaling unit for determining a scale factor depending on the gain level; a gain factor multiplier for multiplying the corresponding digital signal by a scale factor to produce a scaled digital signal.

In some embodiments, the converter operates as a signal train and changes in the variable gain factor at the analog frontend are preferably synchronized with changes in the gain factor multiplier via a temporal delay in the gain scaling unit, applying the scale factor to the gain factor multiplier.

The digital down converter implementation within the receiver includes a variable digital decimation conversion unit as part of the signal train, producing a digital decimated version there from. The embodiment allows for the control mechanism of the receiver to select of decimation parameters such that the digital corruption caused by the step discontinuity of an external attenuator to be limited to a single baseband I and Q sample.

BRIEF DESCRIPTION OF THE DRAWINGS

Embodiments of the invention will now be described, by way of example only, with reference to the accompanying drawings in which.

DETAILED DESCRIPTION

The embodiments of the present invention are directed to an electronic digital signal processing and analog circuit control method which can be used as part of a digital receiver, that allows the amplitude of an input signal (such as a received Analog Radio Frequency (RF) signal) to be varied by switchable attenuation such that the signal corruption at the output of a digital receiver caused by an attenuation switch is greatly suppressed whilst sampling.

This is achieved by scaling the Analog to Digital Converter (ADC) samples in the Digital Domain synchronously with the attenuation switching in the Analog Domain. By using high-speed attenuators in the Analog stage of the circuit and appropriate selection of decimation parameters within the digital side of the circuit, the sampled Analog corruption caused by on-line attenuation switching can be compressed into just one digital-domain sample. This method of on-line, reduced-corruption automatic gain control is referred to as Firmware Level Control (FLC).

The preferred embodiments introduce an improvement to the ALC algorithm which allows on-line adjustment of receiver gain whilst maintaining sample alignment. This is denoted Firmware Level Control (FLC). FLC can be a component resident within the hardware of a particular receiver, monitoring the state of the ADC and its connecting RF front-end to ensure that the ADC is always being driven into full scale and simultaneously scales the captured digitised samples from the ADC to account for the on-line adjustment of the RF front end.

From an external point of view, a direct-digital Radio receiver fitted with FLC appears to have fixed gain, however in reality the Analog section gain is varied to ensure the ADC operates at the optimum level.

An exemplar FLC module monitors the HF environment continuously and calculates the analog gain required for optimum ADC performance. Where gain adjustment is determined to be required, the FLC module requests a gain change using ultra-fast switching attenuators situated on the RF front-end that precedes the monitored ADC. The FLC module ensures that the adjustments are achieved in a series of small steps rather than a single large change. The FLC module then compensates for the gain adjustment by digitally scaling the output of the ADC by a new scale factor, after a carefully calculated delay equal to the propagation time of the signal from the attenuator through to the ADC prior to providing the samples to any DDCs. The receiver now has fixed gain when referenced to the input port and does not require the signal processing computer to scale the gain.

Figure 1:
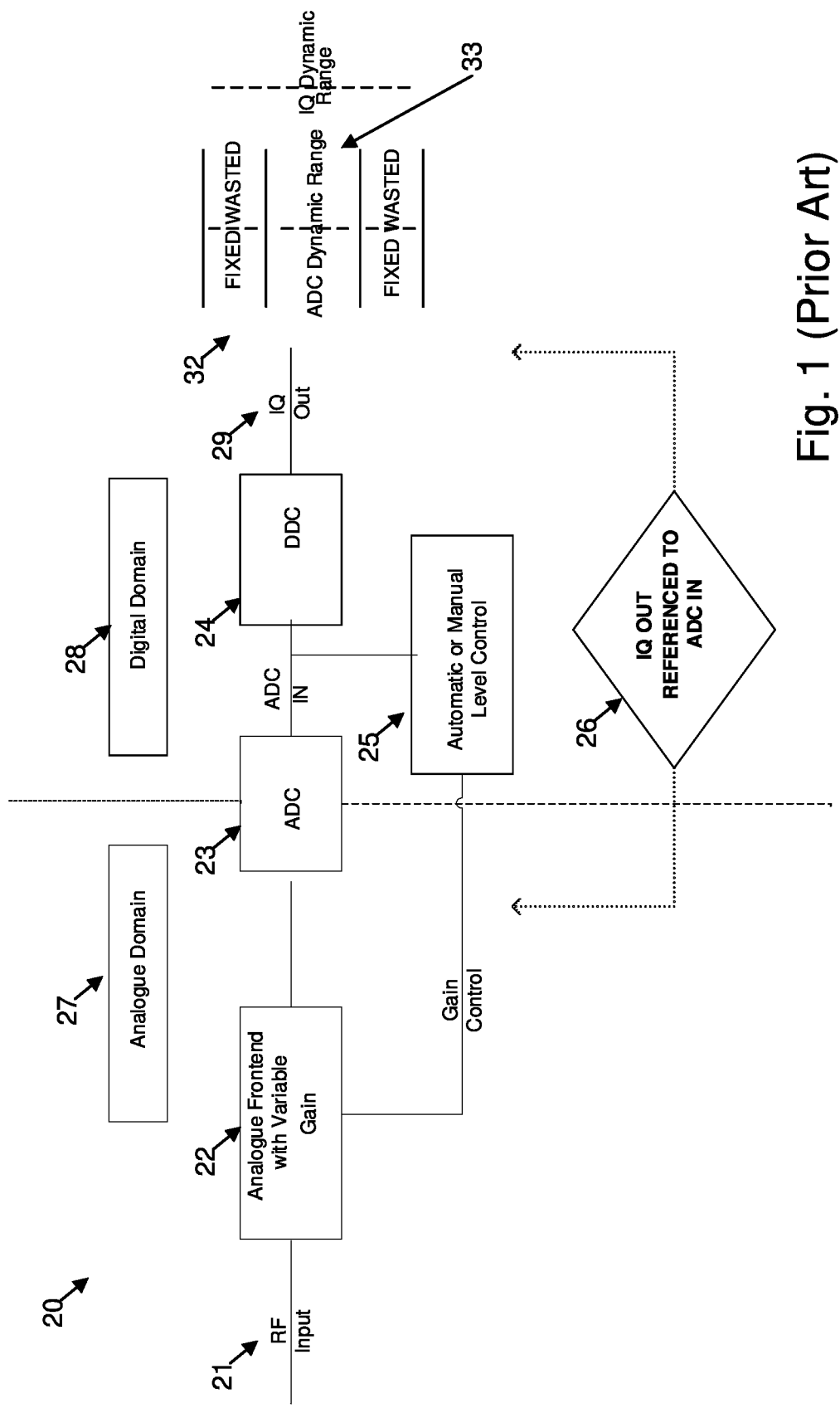
FIG. 1 illustrates schematically a traditional direct-digital receiver architecture without the advantages of the embodiment.
Figure 2:
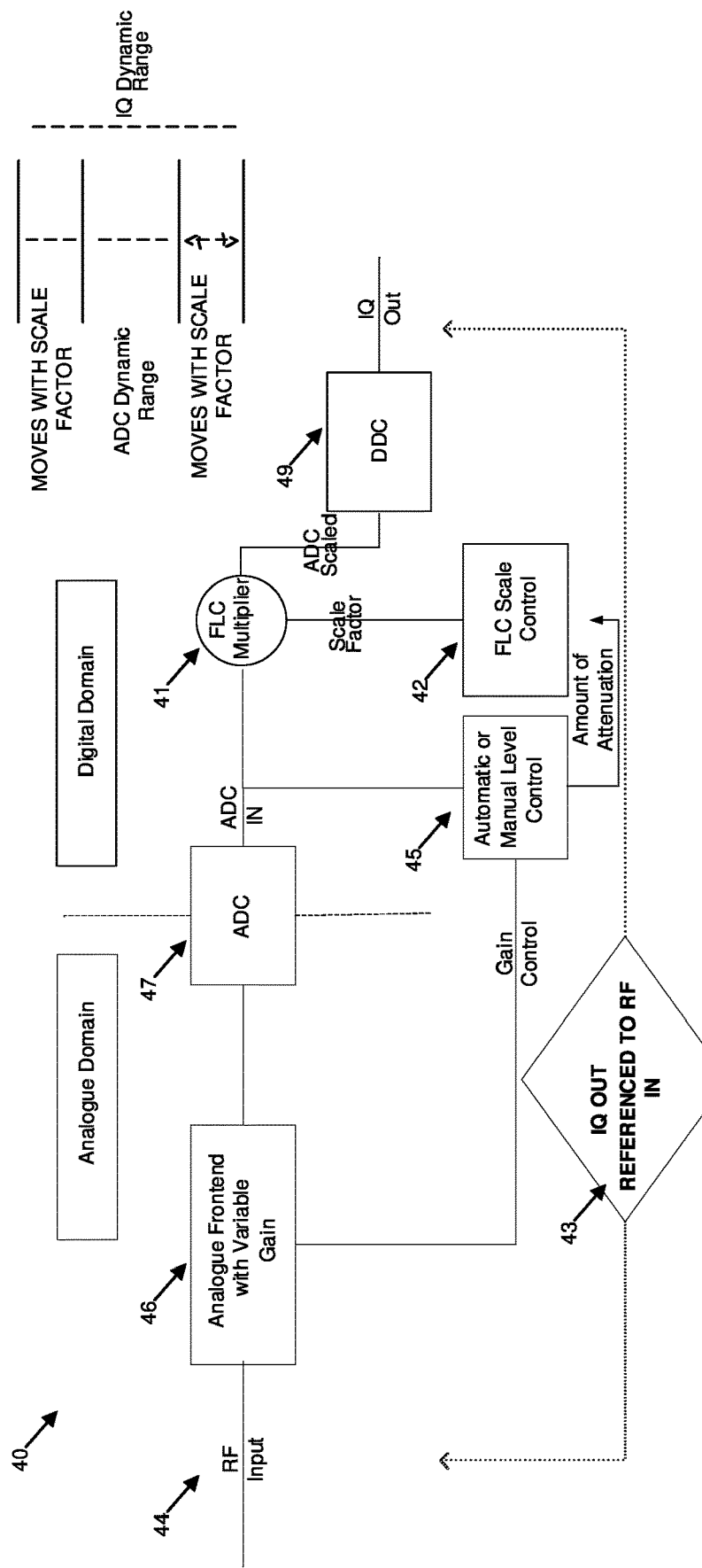
FIG. 2 illustrates schematically a receiver architecture which incorporates the advantages of the embodiment.

Turning now to FIG. 2, there is illustrated an example embodiment 40. The digital receiver has an architecture which supports Firmware Level Control in the Digital Domain and can also support a traditional Automatic Level Control or Manual Level Control algorithm. The inclusion of the FLC into the exemplar architecture adds an additional Multiplier 41 and a dedicated FLC Scale Control component 42 described hence.

The FLC Scale Control component 42 performs two functions. The first is to output a scale factor that can digitally compensate for the amount of attenuation being switched in and the second is to time align the output of that scale factor with the attenuation switch. With respect to the first, the scale factor is calculated such that, if no attenuation is switched in, the scale factor is 1. If some attenuation is switched in, the scale factor is a value that if multiplied by the ADC input will result in a value that compensates for the amount of attenuation switched in.

For example, starting with an external RF signal input 44 to the Analog Domain at 3 dBm and an ADC headroom setting of 2 dB. The Analog Domain has unity gain and 0 dB of attenuation switched in. Since there is no attenuation switched in the scale factor is 1. In this case the output of the ADC would represent 3 dBm, and because there is no attenuation and unity gain it is also the same value as the power input to the receiver.

Measuring the external RF signal power with respect to the ADC headroom, the FLC algorithm 45 then switches in 1 dB of attenuation to satisfy the headroom parameter. The external RF input is still 3 dBm, but after attenuation 46, only 2 dBm is input to the ADC 47, and the output of the ADC would represent 2 dBm. Since there is 1 dB of attenuation, the Scale Control component 42 outputs a value that, when multiplied 41 with the ADC output samples would represent 3 dBm.

With respect to the second delay function of the Scale component, there is a delay between when the attenuation switch occurs and when the Scale component outputs the new scale factor. This delay is tuned for the receiver to be a value that compensates for the delay between when the Level control commands the Analog Domain to switch attenuation 46 and when the first corrupted sample comes out of the ADC.

The FLC multiplier 41 continually multiplies every sample output from the ADC 47 by a scale factor prior to passing the samples to the Digital Down Converter 49.

The effect of the FLC Scale Control 42 and FLC Multiplier 41 is that the step discontinuity in the ADC sample level due to attenuation switching is now compensated for. However, there is still ADC output sample corruption due to the attenuator switch time. The effect of this is significantly reduced by the decimation employed in the Digital Down Converter 49. For example, if a variable attenuator corrupts 60 samples while it switches, and the Digital Down Converter decimates by 100, then all the 60 samples worth of corruption will be integrated into one sample.

Furthermore, since most of that corruption is comprised of out of band frequency components, the digital filtering operation of the Digital Down Converter 49 results in greatly reduced corruption during attenuation switching within the frequencies of interest.

As the external RF environment varies in magnitude, the input to the ADC 47 is kept at a constant level with respect to the set Headroom, but the samples that have been FLC processed and input to the DDC 49 remain at a magnitude indicative of the external RF environment. The DDC IQ output should also have enough bits to compensate for the full dynamic range of the ADC and the full attenuation switching range. In this way, the ADC dynamic range can move up or down within the IQ dynamic range 43 compensating for attenuation and referencing IQ output to the input of the receiver, instead of the input to the ADC.

The exemplar method of Firmware Level Control requires deterministic and high resolution timing. It can be implemented in a Field Programmable Gate Array (FPGA) operating at the sample rate of the ADC 47. During the implementation it will be necessary to view the ADC output samples in the FPGA with respect to a trigger that fires when the attenuation is switched. This is necessary to determine the precise number of clock cycles needed for the Scale Control component delay, to ensure scaling is aligned with attenuation switching.

Interpretation

Reference throughout this specification to "one embodiment", "some embodiments" or "an embodiment" means that a particular feature, structure or characteristic described in connection with the embodiment is included in at least one embodiment of the present invention. Thus, appearances of the phrases "in one embodiment", "in some embodiments" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

As used herein, unless otherwise specified the use of the ordinal adjectives "first", "second", "third", etc., to describe a common object, merely indicate that different instances of like objects are being referred to, and are not intended to imply that the objects so described must be in a given sequence, either temporally, spatially, in ranking, or in any other manner.

In the claims below and the description herein, any one of the terms comprising, comprised of or which comprises is an open term that means including at least the elements/features that follow, but not excluding others. Thus, the term comprising, when used in the claims, should not be interpreted as being limitative to the means or elements or steps listed thereafter. For example, the scope of the expression a device comprising A and B should not be limited to devices consisting only of elements A and B. Any one of the terms including or which includes or that includes as used herein is also an open term that also means including at least the elements/features that follow the term, but not excluding others. Thus, including is synonymous with and means comprising.

As used herein, the term "exemplary" is used in the sense of providing examples, as opposed to indicating quality. That is, an "exemplary embodiment" is an embodiment provided as an example, as opposed to necessarily being an embodiment of exemplary quality.

It should be appreciated that in the above description of exemplary embodiments of the invention, various features of the invention are sometimes grouped together in a single embodiment, figure or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the Detailed Description are hereby expressly incorporated into this Detailed Description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those skilled in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the invention.

In the description provided herein, numerous specific details are set forth. However, it is understood that embodiments of the invention may be practiced without these specific details. In other instances, well-known methods, structures and techniques have not been shown in detail in order not to obscure an understanding of this description.

Similarly, it is to be noticed that the term coupled, when used in the claims, should not be interpreted as being limited to direct connections only. The terms "coupled" and "connected," along with their derivatives, may be used. It should be understood that these terms are not intended as synonyms for each other. Thus, the scope of the expression a device A coupled to a device B should not be limited to devices or systems wherein an output of device A is directly connected to an input of device B. It means that there exists a path between an output of A and an input of B which may be a path including other devices or means. "Coupled" may mean that two or more elements are either in direct physical or electrical contact, or that two or more elements are not in direct contact with each other but yet still co-operate or interact with each other.

Thus, while there has been described what are believed to be the preferred embodiments of the invention, those skilled in the art will recognize that other and further modifications may be made thereto without departing from the spirit of the invention, and it is intended to claim all such changes and modifications as falling within the scope of the invention. For example, any formulas given above are merely representative of procedures that may be used. Functionality may be added or deleted from the block diagrams and operations may be interchanged among functional blocks. Steps may be added or deleted to methods described within the scope of the present invention.

The invention claimed is:

1. A direct-digital receiver architecture comprising:
   an input signal reception unit configured for receiving an analog input signal;
   an analog frontend configured for applying a variable gain factor to the analog input signal so as to produce a gain adjusted input signal;
   an analog to digital converter configured for converting the gain adjusted input signal to a corresponding digital signal comprising a plurality of digital samples;
   a gain level unit configured for determining said variable gain factor via monitoring of the corresponding digital signal;
   a gain scaling unit configured for determining a scale factor according to the variable gain factor; and
   a gain factor multiplier configured for multiplying the corresponding digital signal by the scale factor, thereby producing a scaled digital signal;
   an output dynamic range of the digital samples being equivalent to a dynamic range of the analog to digital converter plus a dynamic range of an analog front-end attenuator that precedes the analog to digital converter.

2. The direct-digital receiver architecture of claim 1, wherein said input signal is digitised and operates in a continuous iterative manner.

3. The direct-digital receiver architecture of claim 2, wherein the digitised samples are of a constant reference level whilst fluctuations occur in a reference level of the analog input signal.

4. The direct-digital receiver architecture of claim 2, wherein said variable gain factor is synchronized with changes in the gain factor multiplier via a temporal delay in applying by the gain scaling unit of the scale factor to the gain factor multiplier, thereby maintaining the digital reference level.

5. The direct-digital receiver architecture of claim 1, wherein a digital decimation of samples restricts a corruption caused by step-attenuation into a single digital sample.

* * * * *